United States Patent [19]
Davis

[11] Patent Number: 6,137,173
[45] Date of Patent: Oct. 24, 2000

[54] PREVENTING BACKSIDE ANALYSIS OF AN INTEGRATED CIRCUIT

[75] Inventor: Derek L. Davis, Phoenix, Ariz.

[73] Assignee: Intel Corporation, Santa Clara, Calif.

[21] Appl. No.: 09/107,823

[22] Filed: Jun. 30, 1998

[51] Int. Cl.[7] .................................................. H01L 23/535
[52] U.S. Cl. ........................ 257/730; 257/786; 257/773
[58] Field of Search ................................. 257/729, 730, 257/788, 922, 786, 48, 773

[56] References Cited

U.S. PATENT DOCUMENTS

| | | | |
|---|---|---|---|
| 4,131,985 | 1/1979 | Greenwood et al. | 29/580 |
| 4,829,018 | 5/1989 | Wahlstrom | 437/51 |
| 4,954,458 | 9/1990 | Reid | 437/51 |
| 4,990,996 | 2/1991 | Kumar et al. | 257/786 |
| 5,034,343 | 7/1991 | Rouse et al. | 437/86 |
| 5,087,585 | 2/1992 | Hayashi | 437/51 |
| 5,229,647 | 7/1993 | Gnadinger | 257/785 |
| 5,318,663 | 6/1994 | Buti et al. | 156/636 |
| 5,382,759 | 1/1995 | Kei Lau et al. | 174/264 |
| 5,426,072 | 6/1995 | Finnila | 437/208 |
| 5,453,404 | 9/1995 | Leedy | 437/203 |
| 5,474,958 | 12/1995 | Djennas et al. | 257/676 |
| 5,503,704 | 4/1996 | Bower et al. | 156/281 |
| 5,604,376 | 2/1997 | Hamburgen et al. | 257/676 |
| 5,767,527 | 6/1998 | Yoneda et al. | 257/48 |
| 6,001,671 | 12/1999 | Fjelstad | 438/112 |

*Primary Examiner*—David Hardy
*Attorney, Agent, or Firm*—Blakely, Sokoloff, Taylor & Zafman LLP

[57] ABSTRACT

An integrated circuit device comprised of a backlapped integrated circuit (IC) and a molding compound. The molding compound is deemed to be secure if it is made of a material which, when tampered, increases the likelihood of damaging a portion of the IC. Otherwise, the molding compound is deemed to be non-secure. This molding compound substantially surrounds the backlapped IC in order to prevent unwanted and unauthorized physical analysis.

13 Claims, 5 Drawing Sheets

PREVENTING BACKSIDE ANALYSIS OF AN INTEGRATED CIRCUIT

BACKGROUND OF THE INVENTION

1. Field of the Invention

The invention relates to the field of data security. More particularly, the invention relates to an integrated circuit package and corresponding method for decreasing the vulnerability of a packaged integrated circuit to various reverse engineering and physical analysis techniques.

2. Background

For the last decade or so, many high-technology companies have been subjected to misappropriation of proprietary information. In electronics, for example, misappropriation has occurred through reverse-engineering techniques in which an integrated circuit (IC) die of an electronic device is directly probed and analyzed. In order to increase the complexity of reverse-engineering tactics, an IC die typically is encased with a solid packaging material that is difficult to penetrate. On occasion, a coating is applied to a top surface of the IC die before application of the outer packaging material. If tampered, this coating is designed to react violently, corrosively or exothermically, in order to render the IC die inoperable by destroying a portion of circuitry within the IC die.

Over the last few years, the technology for analyzing an IC die has improved, in part, due to improved IC die failure identification and elimination techniques by IC manufacturers. One technique, namely backside analysis, has become a highly developed and effective tool for IC die failure identification. "Backside analysis" is a technique in which an IC die is analyzed by etching or grinding a backside of a package to expose a portion of the integrated circuit. Thereafter, lasers, etching, ion bombardment and the like may be used to gain information regarding the integrated circuit or data stored therein.

Currently, there is no protection against exposure and analysis of the backside of the IC die. Physical removal of the outer packaging material may create micro-fractures on the backside surface; however, these micro-fractures would not effect the operability of the IC die. Similarly, the use of die coating is ineffective against backside analysis because the coating would simply disrupt the inactive backside surface of the IC die.

Hence, it would be advantageous to develop a packaged IC and packaging technique to provide greater protection against reverse engineering and physical analysis tactics.

BRIEF SUMMARY OF THE INVENTION

The present invention relates to a secure integrated circuit. The integrated circuit is comprised of a backlapped integrated circuit and a molding compound. The molding compound substantially surrounds the backlapped integrated circuit.

BRIEF DESCRIPTION OF THE DRAWINGS

The features and advantages of the present invention will become apparent from the following detailed description of the present invention in which.

DETAILED DESCRIPTION OF THE INVENTION

A packaged integrated circuit and method are described for reducing susceptibility to reverse engineering or physical analysis. Herein, numerous details are set forth. However, it should be borne in mind that the present invention may be practiced without these specific details and may find wide application for use in any type of integrated circuit device such as processors, coprocessors, memory, and controllers for example.

For the scope of this application, a number of terms are used to describe certain elements of the present invention. For example, a "backlapped IC" is an integrated circuit (IC) die that has undergone partial or complete removal of one or more selected semiconductor layers in order to reduce the thickness of the IC die. For example, the substrate layer of the IC die may be removed, allowing one or more device layers to remain. Herein, a "device layer" comprises a group of active or passive devices. Examples of "active devices" include transistors (e.g., bipolar junction transistors, field-effect transistors, etc.) while "passive devices" include resistors, capacitors and/or inductors. A "secure IC" includes a backlapped IC generally encapsulated within a package. An "electronic system" includes a product utilizing a secure IC such as, for example, a computer (e.g., desktop, laptop, hand-held, server, etc.), imaging equipment (e.g., facsimile machine, printer, digital camera, etc.), wireless equipment (e.g., cellular phones) and the like.

Figure 1:
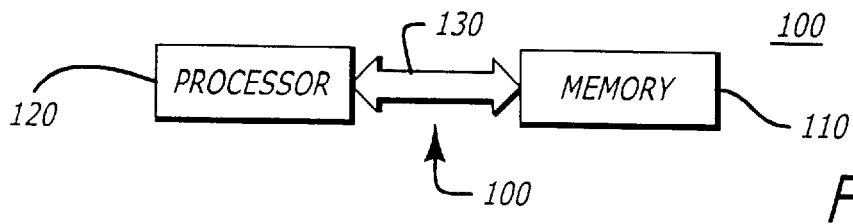
FIG. 1 is an illustrative embodiment of an electronic system featuring a processor fabricated in accordance with the present invention.

Referring now to FIG. 1, an embodiment of an electronic system 100, implemented with a packaged integrated circuit constructed in accordance with the present invention, is illustrated. Electronic system 100 comprises a memory 110 and a processor 120 coupled together by a bus 130. In this embodiment, processor 120 is fabricated as a secure IC. It is contemplated, however, that memory 110 may be fabricated as a secure IC in lieu of processor 120 or in combination therewith.

As described below, processor 120 is fabricated by sequentially performing a number of successive processing operations on an integrated circuit (IC), having a top surface placed in a molding compound, to form a backlapped IC. The backlapped IC is packaged by surrounding molding compound and/or the use of other materials in combination. The molding compound may be secure or non-secure. "Secure molding compound" is a material applied over the IC which, when tampered, increases the likelihood of damaging a portion of the IC. Such damage may be attributed to the particular characteristics of the compound. For example, the compound may be difficult to etch or reacts to changes to temperature or atmospheric conditions. The molding compound, whether secure or non-secure, is inert to the effects of chemical materials, contaminants or energy applied in accordance with standard semiconductor manufacturing processes.

Referring now to FIGS. 2–10, a backlapped IC can be formed and primarily removed from a standard processed wafer or even an individual IC die by a variety of methods. One notable method for removing the backlapped IC involves a silicon-on-insulator (SOI) process in accordance with chemical vapor deposition. For ease of illustration, the thicknesses of the material layers forming the backlapped IC are not drawn to scale.

Figure 2:
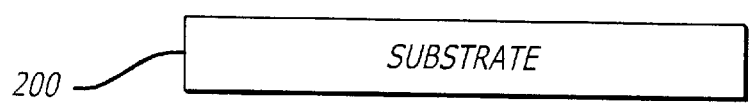
FIGS. 2–9 illustrate an embodiment of the processing technique used to produce a backlapped integrated circuit being packaged to form the secure integrated circuit of FIG. 1.
Figure 3:
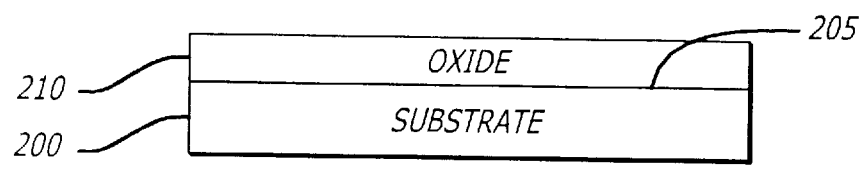

According to the SOI process, a substrate 200 made of semiconductor material (e.g., silicon) is obtained as shown in FIG. 2. Next, as illustrated in FIG. 3, a layer of field oxide 210 is deposited over a top surface 205 of substrate 200 through exemplary techniques such as thermal oxidation or chemical vapor deposition. "Field oxide" 210 is an insulator, such as silicon dioxide ($SiO_2$) for example, which is used for its insulative characteristics and structural integrity in holding the backlapped IC together after being processed.

Figure 4:
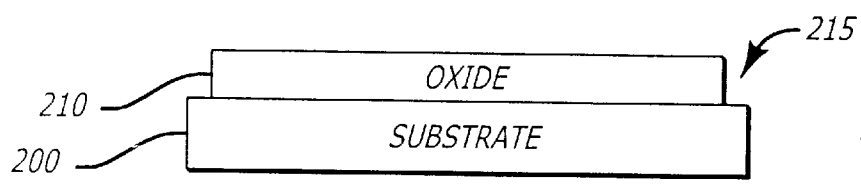
Figure 5:
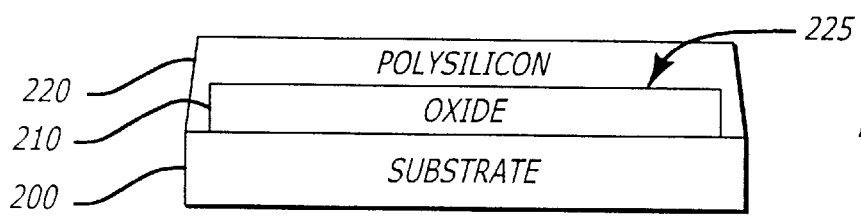
Figure 6:
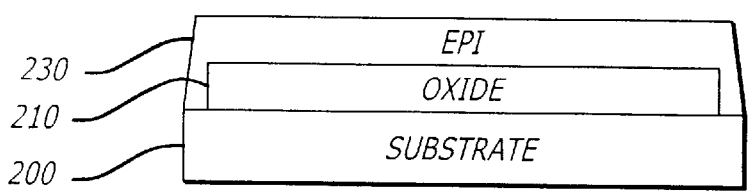

Referring to FIG. 4, field oxide 210 is etched so that a ring 215 of substrate 200 is exposed around the perimeter of field oxide 210. This etching may be accomplished through use of a photoresist. Thereafter, as shown in FIG. 5, a layer of device-grade polysilicon 220 is uniformly deposited over a top surface 225 of field oxide 210. After polysilicon 220 has been deposited, it is annealed to field oxide 210 by applying a temperature slightly below a melting temperature of polysilicon 220 so as to convert polysilicon 220 into a layer of epitaxy (epi) 230 with a crystallographic axis in alignment with substrate 200 (FIG. 6). The epi 230 is used as a base material for active devices and optionally passive devices such as resistors, capacitors and the like. Typically, the thickness of epi 230 is less than 10 microns ($\mu$m), but it is contemplated that this chosen thickness could vary.

Figure 7:
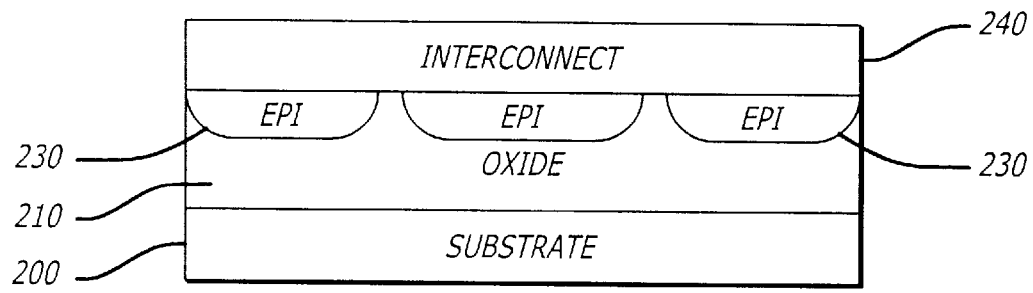

Referring now to FIG. 7, a wafer may be processed to form multiple integrated circuits through standard wafer processing techniques. It may be desirable for field oxide 210 to completely penetrate epi 230 in order to isolate adjacent active devices in epi 230. Of course, such penetration may require field oxide 210 to be added as necessary. In FIG. 7, an interconnect 240 is constructed over epi 230 to couple selected devices together.

Figure 8:
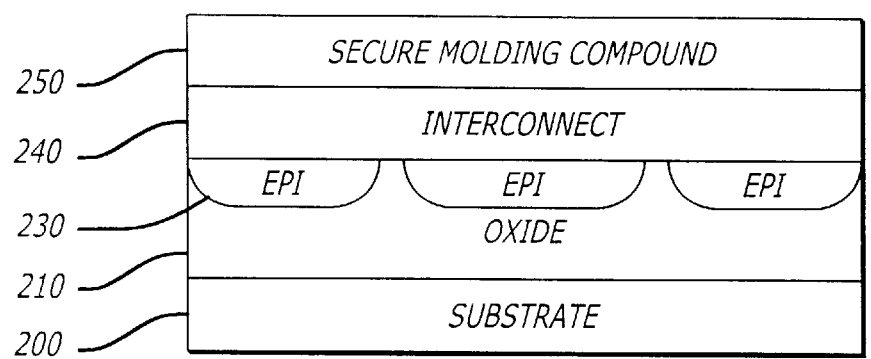
Figure 9:
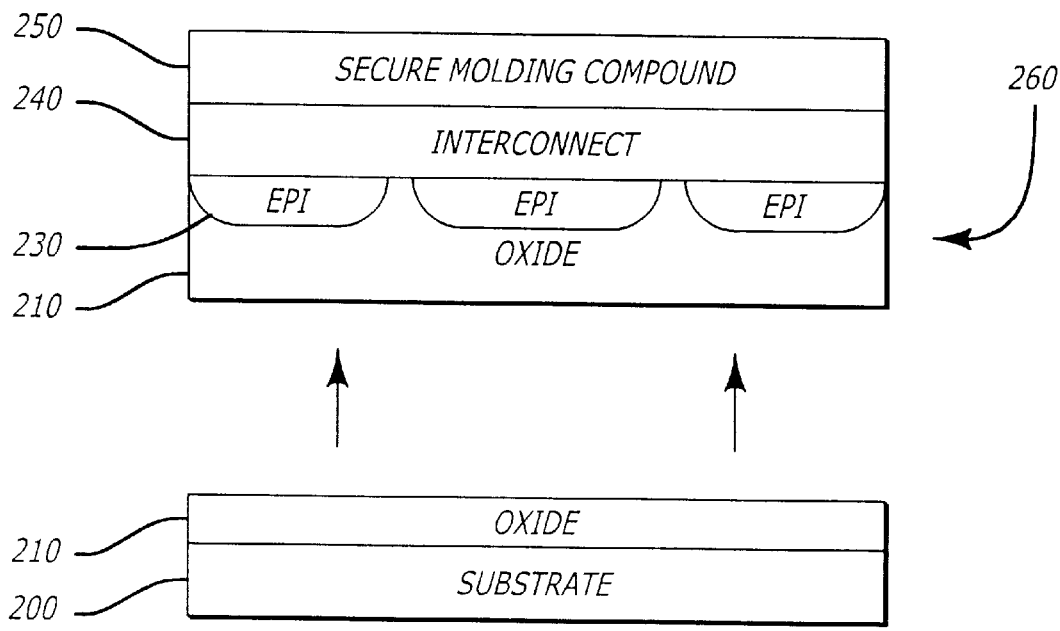

As shown in FIG. 8, molding compound 250 is applied over interconnect 240. Molding compound 250 protects against etching to a surface of interconnect 240 for analysis, and also provides structural support for a resultant backlapped IC 260. Thereafter, as shown in FIG. 9 using the IC die structure of FIG. 8 for simplicity, interconnect 240, epi 230, a portion of field oxide 210 and molding compound 250 are removed from substrate 200 by any standard technique such as etching or thermal shock to backlap and separate backlapped IC 260 from substrate 200.

Figure 10:
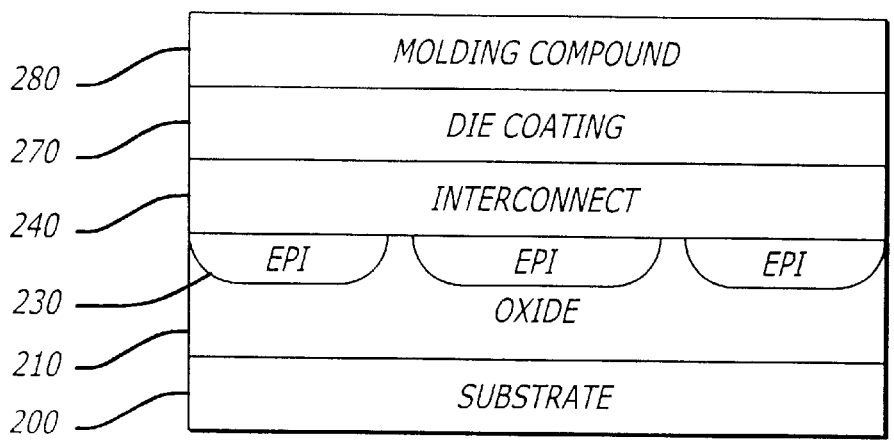
FIG. 10 illustrates an alternative embodiment of an integrated circuit prior to backlapping.

As an alternative embodiment shown in FIG. 10, a die coating 270 is applied against interconnect 240, and thereafter, molding compound 280 may be applied to die coating 270. In this embodiment, die coating 270 provides secondary protection against tampering while molding compound 280 provides structural support for a resultant backlapped IC 260. In this embodiment, the resultant backlapped IC would comprises interconnect 240, epi 230, a portion of field oxide 210 as well as die coating 270 and molding compound 280 when removed from substrate 200.

Figure 11:
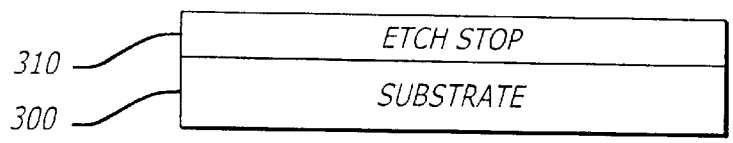
FIGS. 11–14 illustrate an alternative embodiment of the processing technique used to produce a backlapped integrated circuit packaged to form the secure integrated circuit of FIG. 1.

Alternatively, another method for forming and removing the backlapped IC is through an epitaxial etch stop "EES" process as illustrated in FIGS. 11 through 14. While this technique is shown only for use with molding compound, it is appreciated that die coating along with molding compound may be used in the alternative. In the EES process, a substrate 300, made of any semiconductor material, is doped with a polarity opposite from the initial polarity of substrate 300 or with a dopent concentration quite different from its initial concentration. Such doping forms an etch stop 310 being a layer of conductive material on substrate 300 as shown in FIG. 11.

Figure 12:
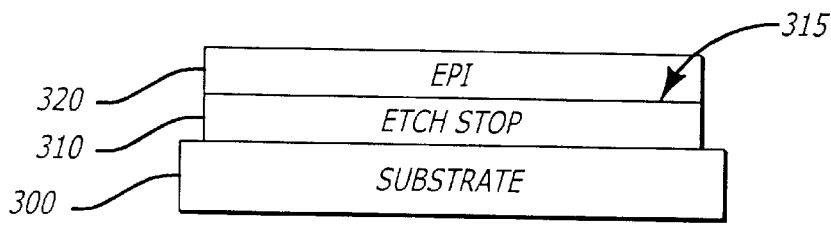
Figure 13:
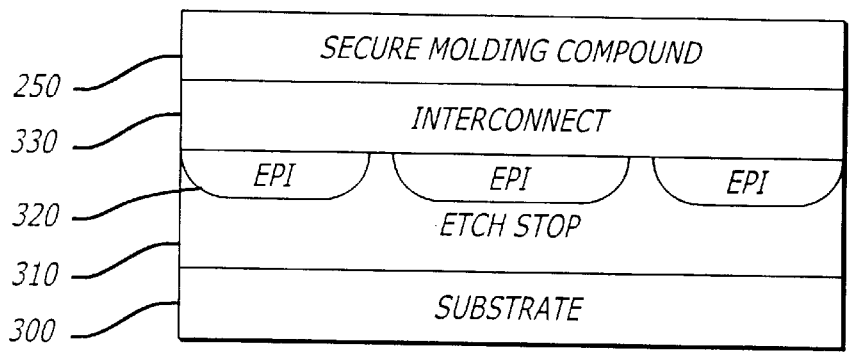

Referring now to FIG. 12, a layer of epi 320 is deposited or grown on a top surface 315 of etch stop 310. Epi 320 is then processed into devices which operate in combination with interconnect 330 to form an integrated circuit. Molding compound 250 is applied over interconnect 330 so as to protect against tampering and to provide structural support for backlapped IC 260 as shown in FIG. 13.

Figure 14:
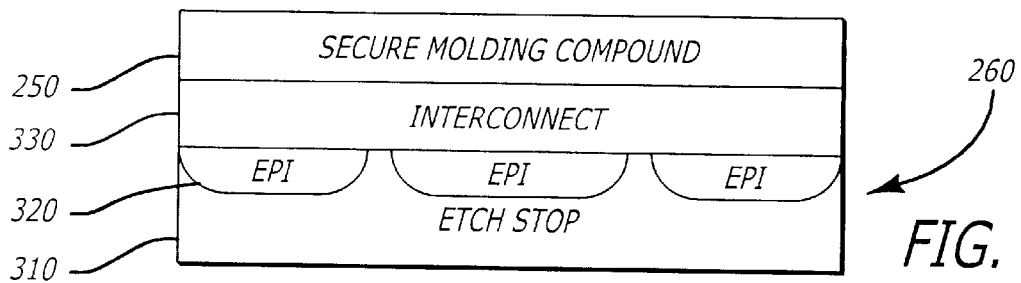

Thereafter, as shown in FIG. 14, backlapped IC 260 comprises molding compound 250, interconnect 330, epi 320, and at least a portion of etch stop 310, which are removed from substrate 200 by any standard technique such as etching or thermal shock. For example, by applying voltage on epi 320 and etch stop 310 when placed an appropriate etch bath, substrate 300 is etched up to etch stop 310 as shown in FIG. 14, leaving backlapped IC 260 virtually intact. Alternatively, if substrate 300 is doped with a different dopent concentration, a selective etch can be used to stop upon detection of the dopent concentration.

Although two processing techniques to produce a backlapped IC have been described, it is contemplated that other processing techniques may be utilized to produce the backlapped IC after the IC die is placed into a molding compound. This can be accomplished through etching, thermal shock or the use of an etch stop and application of a predetermined voltage when placed in an etch bath as described above.

Figure 15:
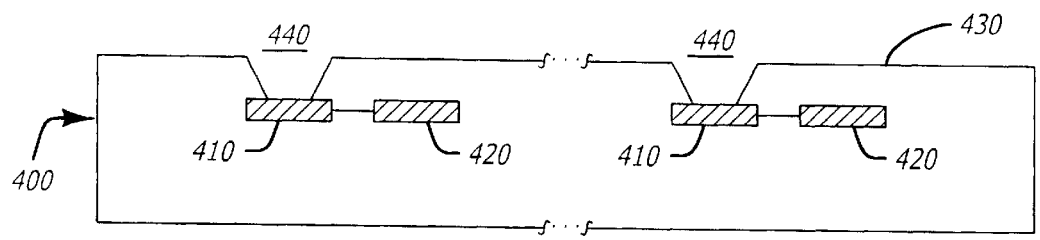
FIG. 15 illustrates an embodiment of the integrated circuit prior to applying molding compound.

As shown in FIG. 15, each IC die 400 includes an original pad set 410 and a redundant pad set 420. Each pad of redundant pad set 420 corresponds to a pad from original pad set 410. Also, these corresponding pads are electrically connected to each other via connection 450 in either serial or in parallel. Original pad set 410 is used for testing IC die 400 prior to backlapping. At that time, redundant pad set 420 remains covered and inaccessible from a top surface 430 of IC die 400. Channels 440 are etched through top surface 430 for testing prior to packaging or backlapping. This etching is performed without exposing redundant pad set 420.

Figure 16:
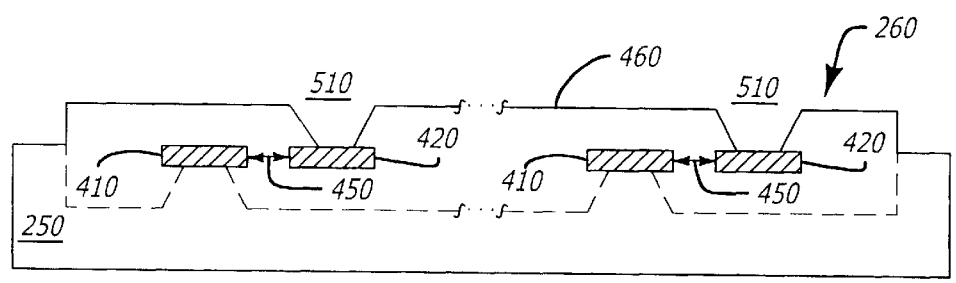
FIG. 16 is an illustrative embodiment of a backlapped integrated circuit being manipulated to produce the secure integrated circuit of FIG. 1.

As shown in FIG. 16, in this embodiment, the IC die is placed topside down into a predetermined amount of molding compound 250. Unlike die coating, molding compound 250 will be used to protect the entire perimeter of the backlapped IC 260 in lieu of its top surface. The particular composition of this molding compound 250 may be maintained as a trade secret or in confidence for national security reasons. While placed topside down into molding compound 250, the backside 460 of IC die 400 is etched. This etching may be accomplished through standard etching techniques to produce a backlapped IC (described above) of a selected thickness. It is noted that molding compound 250 would need to be uneffected by the chosen layer removal process (e.g., etching).

Figure 17:
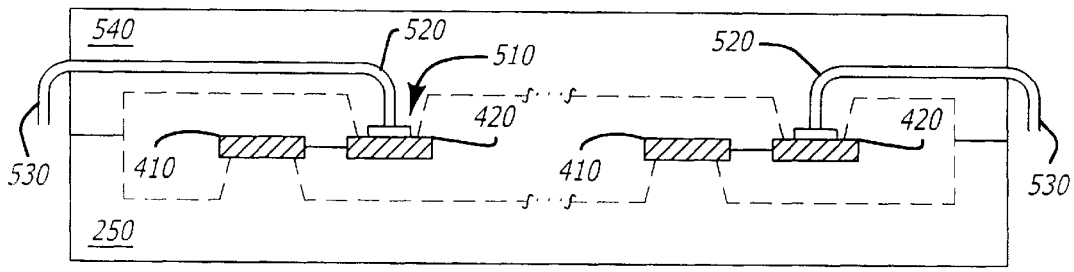
FIG. 17 is a more detailed, illustrative embodiment of the secure integrated circuit of FIG. 1 after connecting the lead frames to the redundant pad set.

Since backlapped IC is topside down in molding compound 250, a number of bonding channels 510 are etched from backside 460 through the backlapped IC to particular redundant bonding pads 420. However, the layering of materials in IC die 400 are patterned so that etching of channels 510 would not expose bonding pads 410. A lead frame 530 is attached to redundant bonding pads 420 through lead wires 520 as shown in FIG. 17. After lead frame 520 is connected, the backlapped IC is packaged through application of another molding compound 540 over the backside of backlapped IC. Each of these molding compounds 250 and 540 may be secure molding compounds, non-secure molding compound or any combination thereof. Also, even if these molding compounds 250 and 540 are identical in function (e.g., both secure molding compounds or both non-secure molding compounds), they may be developed with different compositions. Of course, in addition to molding compound, die coating may be used.

The optimal thickness of the backlapped IC will be experimentally determined through bonding requirements and the reactive characteristics of the chosen molding compound 250. In this embodiment, irrespective of a quantitative thickness value, backlapped IC would have a thickness such that removal of a portion of the secure molding compound during physical analysis would ensure destruction of backlapped IC thereby discontinuing its operability.

What we claim is:

1. A secure integrated circuit comprising:
    a backlapped integrated circuit having a top surface and a bottom surface, the backlapped integrated circuit includes an original set of pads and a redundant set of pads corresponding in number to the original set of pads, each pad of the redundant set of pads is electrically coupled to at least one corresponding pad of the original set of pads and accessible by a lead wire from the top surface; and
    a molding compound substantially covering the original set of pads, the redundant set of pads and at least the top surface and the bottom surface of the backlapped integrated.

2. The secure integrated circuit of claim 1, wherein the backlapped integrated circuit includes an integrated circuit die absent a substrate layer.

3. The secure integrated circuit of claim 1, wherein the backlapped integrated circuit includes a plurality of lead frames, each coupled to a unique pad of the redundant set of pads.

4. The secure integrated circuit of claim 3 further comprising a lead wire coupled to each of the plurality of lead frames and a pad of the redundant set of pads.

5. A secure integrated circuit comprising:
    a backlapped integrated circuit being an integrated circuit die having a top surface, a bottom surface and a plurality of periphery surfaces, the backlapped integrated circuit including
        a first set of bonding pads proximate to the top surface, the first set of bonding pads for testing the backlapped integrated circuit, and
        a second set of bonding pads corresponding to the first set of bonding pads, each bonding pad of the second set of bonding pads being laterally adjacent to a bonding pad of the first set of bonding pads and electrically coupled to a corresponding bonding pad of the first set of bonding pads;
    a first molding compound substantially surrounding the top surface and a portion of each periphery surface of the backlapped integrated circuit; and
    a second molding compound substantially surrounding the bottom surface and a remainder of each periphery surface of the backlapped integrated circuit.

6. The secure integrated circuit of claim 5, wherein the backlapped integrated circuit includes an integrated circuit die absent a substrate layer.

7. The secure integrated circuit of claim 5, wherein the first molding compound is identical in composition to the second molding compound.

8. The secure integrated circuit of claim 5, wherein the backlapped integrated circuit further comprises a plurality of lead frames, each lead frame coupled to one of the second set of bonding pads.

9. The secure integrated circuit of claim 8, further comprising a plurality of lead wires each coupled to one of the plurality of lead frames and one of the second set of bonding pads.

10. A secure integrated circuit comprising:
    a backlapped integrated circuit being an integrated circuit die having a top surface and a bottom surface, the backlapped integrated circuit including
        a first set of bonding pads proximate to the top surface, the first set of bonding pads for testing the backlapped integrated circuit, and
        a second set of bonding pads corresponding to the first set of bonding pads,
    each bonding pad of the second set of bonding pads being adjacent and electrically coupled to a bonding pad of the first set of bonding pads; and
    a molding compound substantially covering the first set of bonding pads, the second set of bonding pads the top surface and the bottom surface of the backlapped integrated circuit.

11. The secure integrated circuit of claim 10, wherein the backlapped integrated circuit includes an integrated circuit die absent a substrate layer.

12. The secure integrated circuit of claim 10, wherein the backlapped integrated circuit includes a plurality of lead frames, each coupled to a unique bonding pad of the second set of bonding pads.

13. The secure integrated circuit of claim 10, wherein the molding compound includes
    a first molding compound substantially covering the top surface and a portion of each periphery surface; and
    a second molding compound substantially surrounding the bottom surface and a remainder of the periphery surfaces, the second molding compound differs in composition from the first molding compound.

* * * * *